United States Patent
Boyd

(10) Patent No.: US 7,534,706 B2
(45) Date of Patent: May 19, 2009

(54) RECESSED POLY EXTENSION T-GATE

(75) Inventor: James G. Boyd, Pflugerville, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 181 days.

(21) Appl. No.: 11/348,021

(22) Filed: Feb. 6, 2006

(65) Prior Publication Data

US 2007/0184642 A1 Aug. 9, 2007

(51) Int. Cl.
*H01L 21/28* (2006.01)
*H01L 21/44* (2006.01)

(52) U.S. Cl. ................... 438/574; 438/579; 438/592; 438/303; 438/44

(58) Field of Classification Search ......... 438/592, 438/303, 579, 44
See application file for complete search history.

(56) References Cited

U.S. PATENT DOCUMENTS

| | | | | |
|---|---|---|---|---|
| 5,559,049 A | * | 9/1996 | Cho | 438/304 |
| 5,920,783 A | * | 7/1999 | Tseng et al. | 438/305 |
| 6,287,924 B1 | * | 9/2001 | Chao et al. | 438/300 |
| 6,509,253 B1 | * | 1/2003 | Yu | 438/585 |
| 6,607,950 B2 | * | 8/2003 | Henson et al. | 438/197 |
| 6,621,131 B2 | * | 9/2003 | Murthy et al. | 257/408 |
| 7,101,766 B2 | * | 9/2006 | Jung | 438/304 |
| 7,238,561 B2 | * | 7/2007 | Zhang et al. | 438/197 |
| 7,253,066 B2 | * | 8/2007 | Abadeer et al. | 438/303 |
| 2007/0173002 A1 | * | 7/2007 | Hall et al. | 438/184 |
| 2007/0173004 A1 | * | 7/2007 | Hall et al. | 438/197 |

OTHER PUBLICATIONS

U.S. Appl. No. 11/195,510 entitled Method for Forming Uniaxially Strained Devices; filed Aug. 2, 2005; Zhang, Da et al. (20 pages).

* cited by examiner

*Primary Examiner*—Thao X Le
*Assistant Examiner*—Eric W Jones
(74) *Attorney, Agent, or Firm*—John A. Fortkort; Fortkort & Houston P.C.

(57) ABSTRACT

A method is provided for making a silicided gate in a semiconductor device. In accordance with the method, a gate (213) is provided which comprises a first portion (214) and a second portion (213). The first portion of the gate has a width $w_1$ and the second portion of the gate has a width $w_2$ as taken along a plane perpendicular to the length of the gate, wherein $w_2 > w_1$. A layer is silicide (231) is then formed on the second portion.

16 Claims, 5 Drawing Sheets

RECESSED POLY EXTENSION T-GATE

FIELD OF THE DISCLOSURE

The present disclosure relates generally to semiconductor devices, and more particularly to methods for forming gate structures in the same.

BACKGROUND OF THE DISCLOSURE

Cobalt silicide has emerged as a common contact material for forming contacts to silicon in CMOS devices, due to its low resistivity, high stability, and small lattice mismatch with silicon. Moreover, as compared to many other contact materials (including other metal silicides, such as titanium silicide), cobalt silicide can be readily patterned into relatively small dimensions.

Unfortunately, the ongoing trend toward smaller device sizes in semiconductor fabrication processes is currently testing the limitations of cobalt silicide technology. In particular, as polysilicon gate lengths decrease, it becomes increasingly challenging to form uniform layers of cobalt silicide on these gates. Indeed, at dimensions below about 50 nm, extensive voiding occurs in cobalt silicide films, so that uniform cobalt silicide films cannot be formed in a reproducible manner.

There is thus a need in the art for a method for forming silicided polysilicon gates which overcomes the aforementioned infirmity. In particular, there is a need in the art for forming silicided polysilicon gates in which the gates have dimensions below 50 nm. These and other needs may be met by the devices and methodologies described herein.

DETAILED DESCRIPTION

In one aspect, a method is provided for making a silicided gate in a semiconductor device. In accordance with the method, a gate is provided which has at least one spacer structure adjacent thereto, wherein said spacer structure is separated from said gate by a dielectric layer. The dielectric layer is then etched to produce a gap between the gate and the spacer structure, and a gate material is deposited in the gap (e.g., to extend the gate into the gap).

These and other aspects of the present disclosure are described in greater detail below.

It has now been found that the aforementioned needs in the art may be met by forming gate structures (referred to herein as T-gate structures) having first and second portions, and wherein the first portion is wider than the second portion. For example, such gate structures can be made with a top portion having a width of 50 nm or greater, and a base having a width that is substantially smaller than 50 nm. Such gate structures combine the need for reduced gate dimensions with a gate surface area that is sufficiently large to permit uniform layers of cobalt silicide to be formed on the gate in a reproducible manner. Such gate structures also provide reduced polysilicon line resistance, increased device speeds, and relaxed polysilicon-to-contact overlay requirements.

Figure 1:
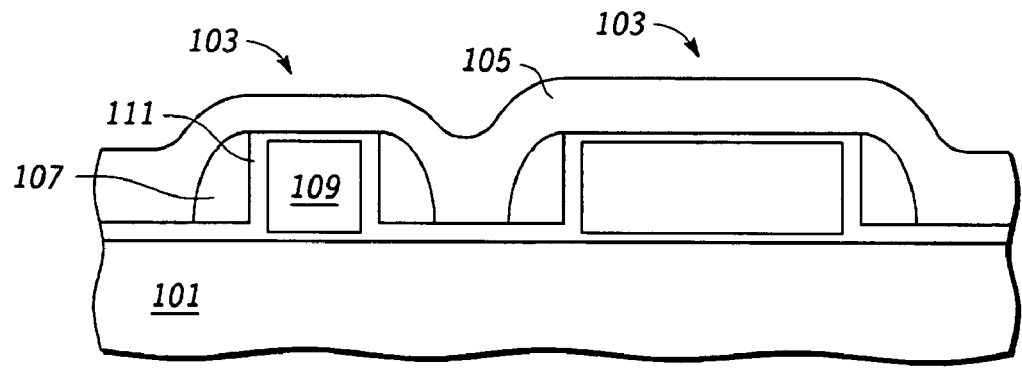
FIG. 1 is an illustration of a step in a process for making a recessed extension gate in accordance with the teachings herein.

The methodologies disclosed herein may be further appreciated with respect to the first particular, non-limiting embodiment depicted in FIGS. 1-11. As shown in FIG. 1, a substrate 101 is provided upon which is defined a plurality of gate structures 103. The substrate 101 may be of various types, including bulk wafer substrates and SOI (semiconductor-on-insulator) substrates. A layer of photoresist 105 is disposed over the gate structures 103 and is preferably planarized, as through chemical-mechanical planarization.

The gate structures 103 each comprise (preferably nitride) spacers 107 and a polysilicon gate 109, and are configured such that the gate is separated from the spacers 107 by a spacer dielectric 111. Gate structures of this type are well known to the art, and may be formed, for example, by depositing a conformal layer of spacer material over a gate 109 upon which has been deposited or grown a layer of spacer dielectric 111, and then anisotropically etching the spacer material to define the spacers 107.

Figure 2:
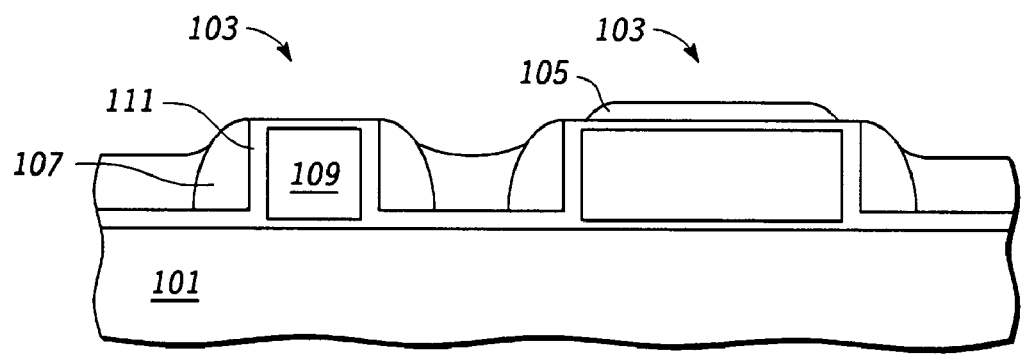
FIG. 2 is an illustration of a step in a process for making a recessed extension gate in accordance with the teachings herein.
Figure 3:
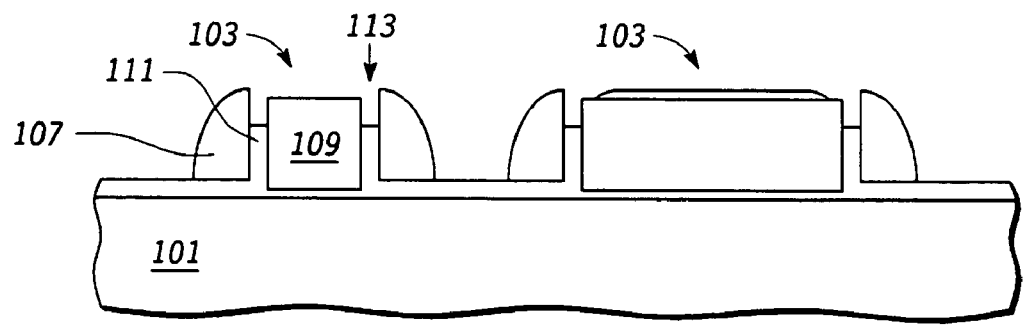
FIG. 3 is an illustration of a step in a process for making a recessed extension gate in accordance with the teachings herein.

With reference to FIG. 2, the layer of photoresist 105 is etched back to expose the portion of the spacer dielectric 111 in the vicinity of the gate 109. Then, as shown in FIG. 3, the spacer dielectric 111 is etched back to produce a gap 113 between the gate 109 and the adjacent spacers 107, after which the layer of photoresist 105 is stripped.

Figure 4:
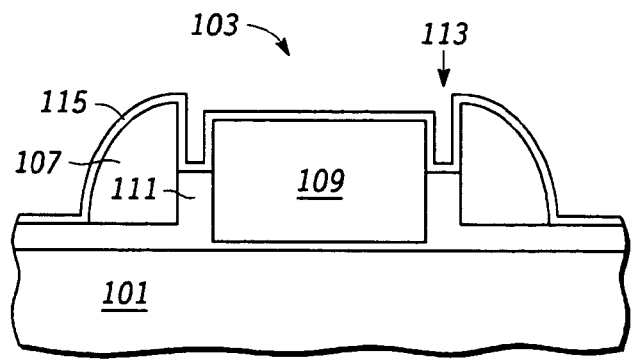
FIG. 4 is an illustration of a step in a process for making a recessed extension gate in accordance with the teachings herein.
Figure 5:
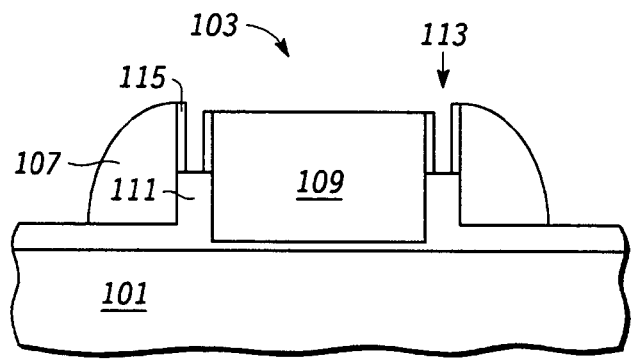
FIG. 5 is an illustration of a step in a process for making a recessed extension gate in accordance with the teachings herein.

With reference to FIG. 4, a nitride layer 115 is deposited over the gate structure 103. The nitride layer 115 preferably comprises silicon nitride and has a thickness which is preferably about 30% the width of the gap 113. The nitride layer 115 is then etched back as shown in FIG. 5 such that a portion of the nitride layer 115 remains on the sidewalls of the spacer structures 107 and the gate 109. Preferably, the etch used for this purpose is an anisotropic etch that is selective to oxide and silicon. The remaining portion of the nitride layer 115 serves to prevent oxide from depositing on the side of the gate 109 during the subsequent oxide deposition step.

Figure 6:
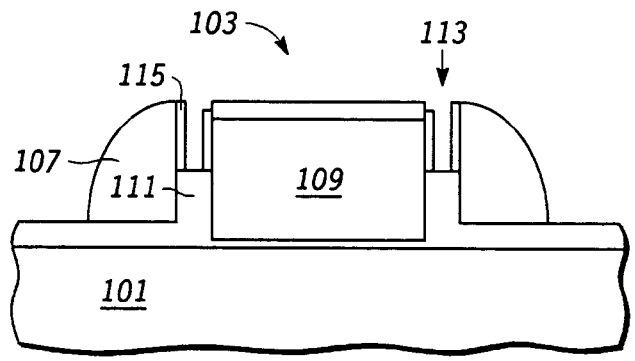
FIG. 6 is an illustration of a step in a process for making a recessed extension gate in accordance with the teachings herein.
Figure 7:
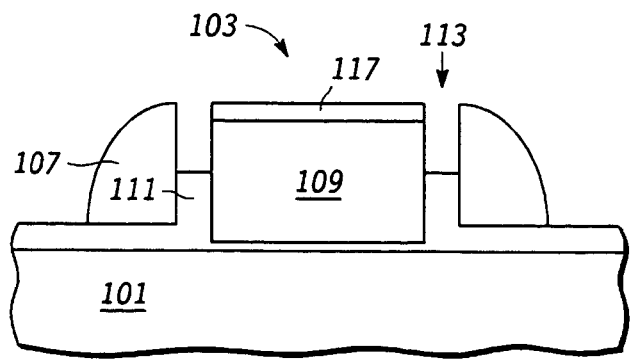
FIG. 7 is an illustration of a step in a process for making a recessed extension gate in accordance with the teachings herein.

Referring now to FIG. 6, an oxide layer 117 is grown over the structure. The oxide layer 117 will preferably be formed in an oxidizing environment during anneal of the source/drain regions (not shown) of the device. The portions of the nitride layer 115 remaining on the sidewalls of the gate 109 and spacers 107 are then removed as shown in FIG. 7, preferably with a short, timed isotropic etch. Since the spacers 107 and the nitride layer 115 preferably both comprise silicon nitride, the etch will typically have the effect of widening and/or tapering the spacers 107 and reducing their width.

Figure 8:
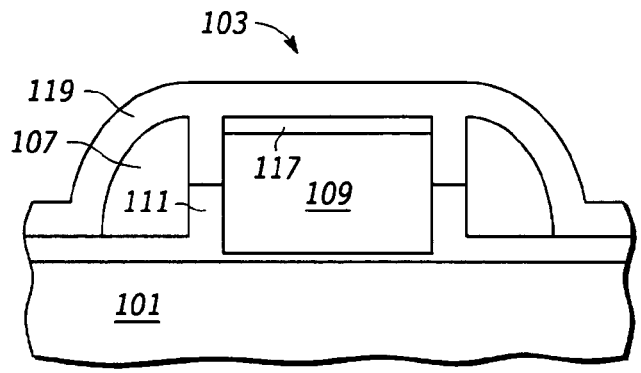
FIG. 8 is an illustration of a step in a process for making a recessed extension gate in accordance with the teachings herein.
Figure 9:
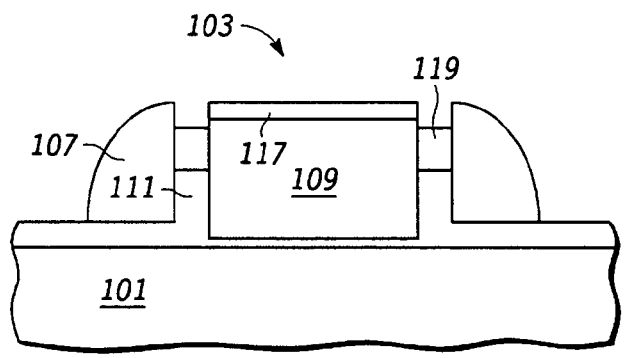
FIG. 9 is an illustration of a step in a process for making a recessed extension gate in accordance with the teachings herein.

With reference now to FIG. 8, a conformal layer of polysilicon 119 is deposited over the structure. The thickness of the polysilicon layer 119 is preferably greater than the width of the gap 113 (see FIG. 7) such that the gap 113 is filled as a result of the deposition. The layer of polysilicon 119 is then etched back as shown in FIG. 9, preferably through the use of a non-anisotropic polysilicon etch which is selective to the material of the oxide layer 117 and the material of the spacers 107. The oxide layer 117 may be used as an etch stop in this process for the purpose of controlling the thickness of the remaining portion of the polysilicon layer 119.

Figure 10:
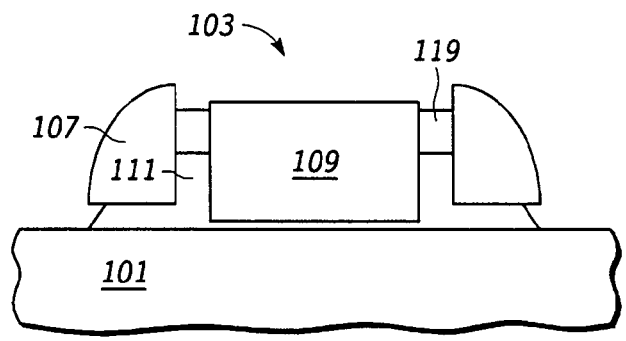
FIG. 10 is an illustration of a step in a process for making a recessed extension gate in accordance with the teachings herein.
Figure 11:
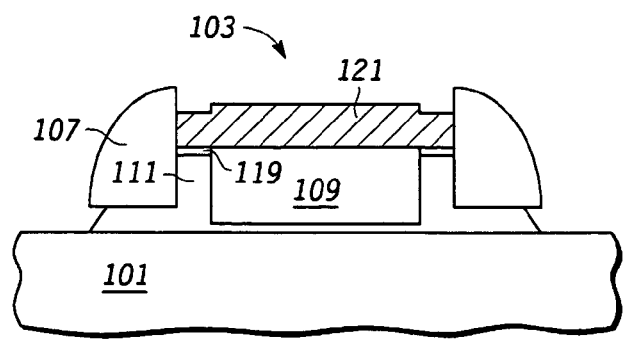
FIG. 11 is an illustration of a step in a process for making a recessed extension gate in accordance with the teachings herein.

Referring now to FIG. 10, the cap oxide 117 and the portion of the spacer dielectric 111 which extends over the source/drain regions is removed as part of a metal silicide pre-clean process. Any residual spacer dielectric 111 remaining on the polysilicon gate structures 103 (see FIG. 3) will also be removed. A layer of metal silicide 121 is then formed over the exposed polysilicon gates (including the remaining portion of the layer of polysilicon 119, which serves as a gate extension) as shown in FIG. 11. The metal silicide 121 is preferably cobalt silicide and is formed by processes well known to the art.

It will be appreciated that the above process results in the definition of a gate extension 119 on either side of the gate 109 such that the resulting composite gate, which comprises the original gate 109 and the gate extensions 119, has a first (top) portion and a second (bottom) portion, and wherein the first portion is wider than the second portion. Accordingly, so long as the width of the first portion is at least about 50 nm, the first portion of the gate 109 may be reproducibly and uniformly silicided, even if the second portion of the gate is much smaller than 50 nm.

It will also be appreciated that various modifications may be made to the process described in FIGS. 1-11. For example, rather than forming a T-shaped gate, it is possible to form only a single gap on one side of the gate (as, for example, by using a single spacer, or by utilizing a pair of spacers but etching the spacer dielectric layer between the gate and only one of the spacers). This approach may be used, for example, to produce gates that have a profile which is L-shaped in cross-section.

In some embodiments, an etch mask may be used to mask a portion of the layer of polysilicon during the etch process. With proper alignment, such a mask may be used to mask a portion of the photoresist layer which extends over the gate and which is wider than the gate. Consequently, the subsequent etch defines a suitable gate extension that effectively widens a portion of the gate. This approach may optionally be used with chemical mechanical polishing to ensure uniformity of the polysilicon layer and the gate extension defined from it.

Figure 12:
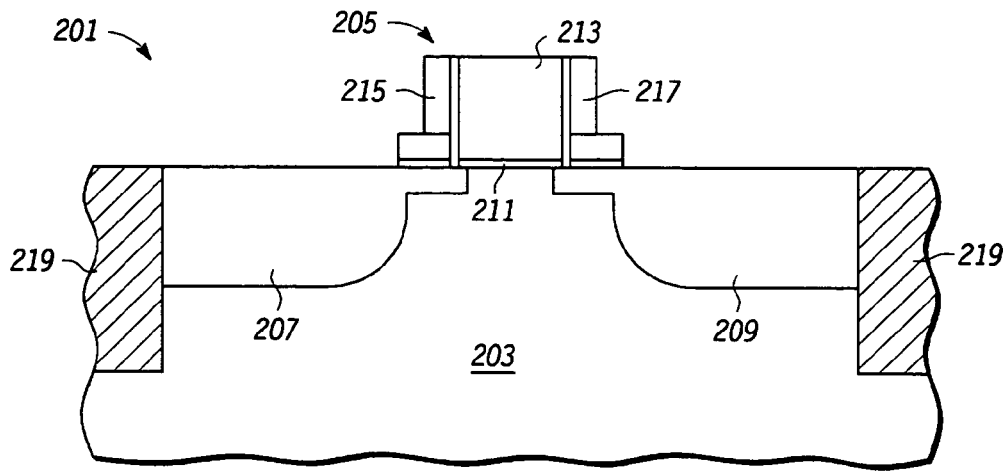
FIG. 12 is an illustration of a step in a process for making a recessed extension gate in accordance with the teachings herein.

FIGS. 12-16 illustrate a second particular, non-limiting embodiment of the methodology disclosed herein. As shown in FIG. 12, a semiconductor structure 201 is provided which comprises a semiconductor substrate 203 having a gate structure 205 disposed thereon. Implant regions 207, 209 have been created by ion implantation on either side of the gate structure 205. The gate structure 205 comprises a gate dielectric 211 and a gate 213, the latter of which is bounded by adjacent spacer structures 215, 217. The semiconductor structure 201 further comprises a plurality of field isolation regions 219.

Figure 13:
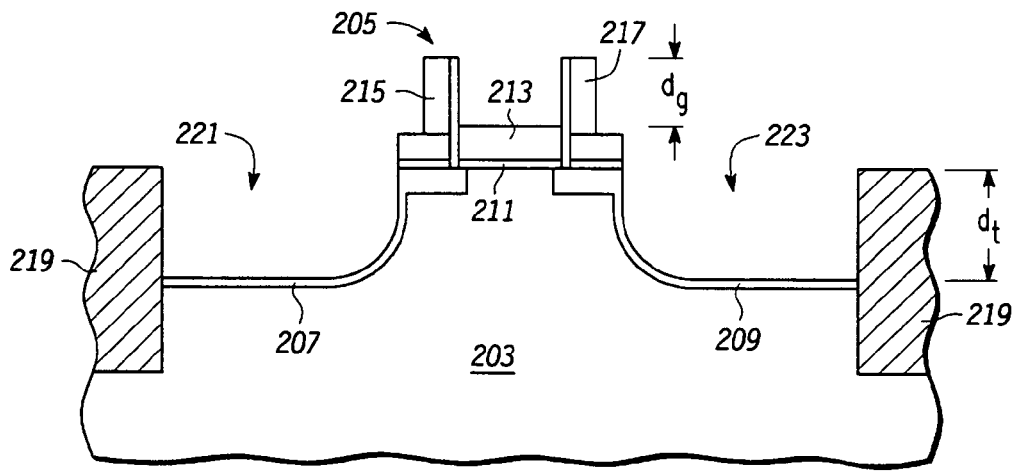
FIG. 13 is an illustration of a step in a process for making a recessed extension gate in accordance with the teachings herein.

As shown in FIG. 13, the semiconductor structure 201 is then subjected to dry etching to remove a portion of the implant regions 207, 209, thereby creating first 221 and second 223 trenches adjacent to the gate structure 205. The dry etch also removes a portion of the gate 213, thereby exposing a portion of the gate dielectric 211 adjacent to the spacer structures 215, 217. Notably, the gate 213 is not necessarily etched at the same rate as implant regions 207, 209. Hence, the depth $d_g$ of the trench formed in the gate electrode by the dry etch may be different than the depth $d_t$ of the trenches 221, 223 formed for the source and drain regions.

Figure 14:
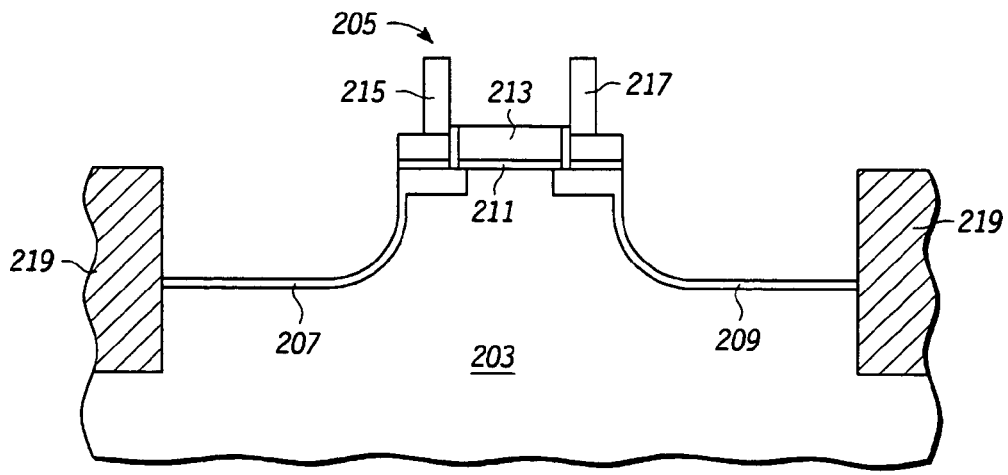
FIG. 14 is an illustration of a step in a process for making a recessed extension gate in accordance with the teachings herein.
Figure 15:
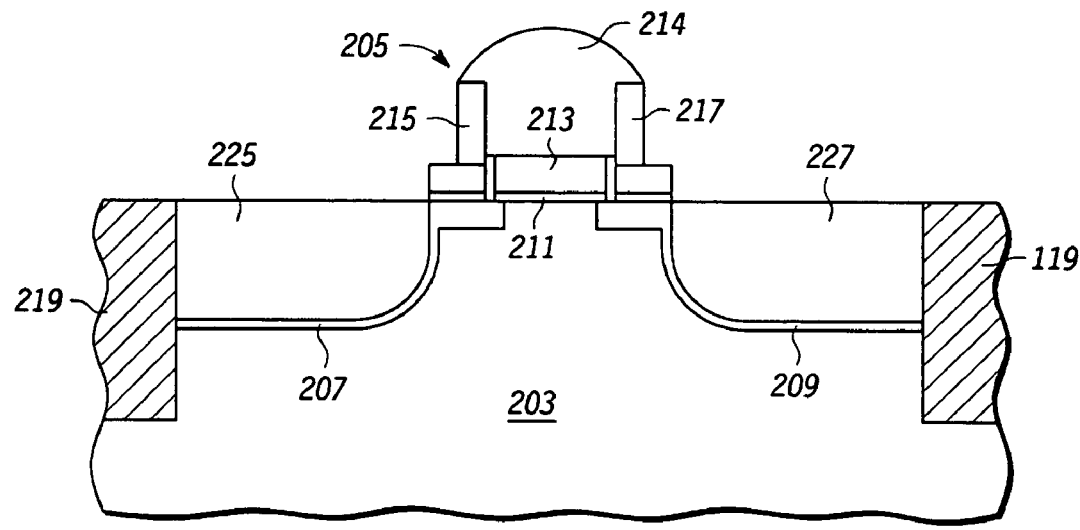
FIG. 15 is an illustration of a step in a process for making a recessed extension gate in accordance with the teachings herein.

As shown in FIG. 14, the exposed portion of the gate dielectric 211 adjacent to the spacer structures 215, 217 is removed through a suitable etch. The semiconductor structure is then subjected to epitaxial growth to form source 225 and drain 227 regions as shown in FIG. 15. The epitaxy process may proceed with in-situ doping. This process also results in film growth on the gate 213, as indicated by the formation of new gate region 214. So long as $d_g \geq d_t$ (and assuming an equal rate of growth in the gate 213 and the source 225 and drain 227 regions) when epitaxial growth of the source 225 and drain 227 regions has concluded, the surface of the gate 213 will be even with, or somewhat lower than, the adjacent spacer structures 215, 217. Also, since a portion of the gate dielectric 211 adjacent to the spacer structures 215, 217 was removed, the epitaxial process results in lateral growth of the gate 213, so that the composite gate structure comprising the original gate region 213 and new gate region 214 is essentially T-shaped in cross-section. This is the situation depicted in FIG. 16, where a layer of silicide 231 has been formed over the new gate region 214. As in the previous embodiment, so long as the new gate portion 214 is sufficiently wide (e.g., 50 nm or greater), the layer of silicide 231 can be formed uniformly and in a reproducible manner, while the original gate region 213 can be made substantially smaller.

Figure 16:
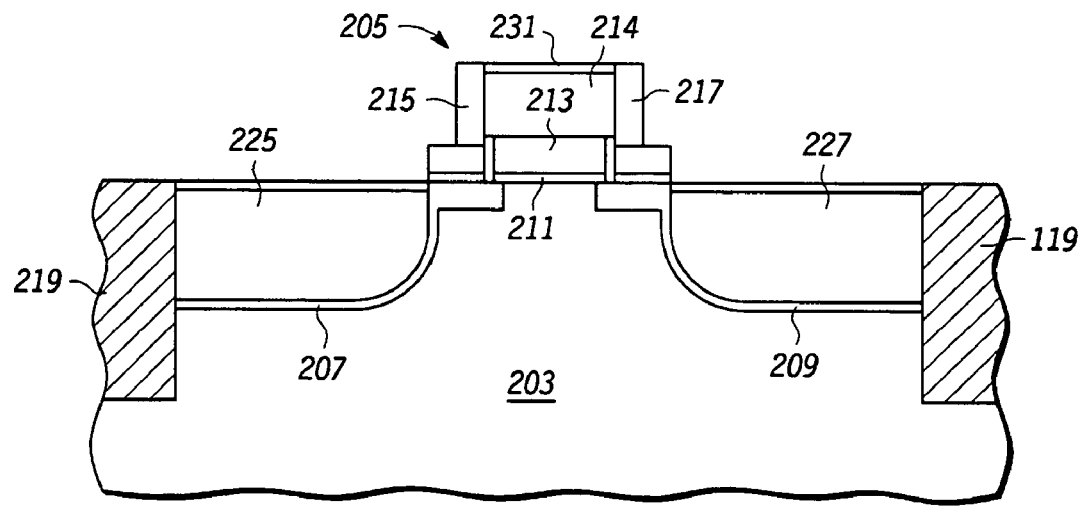

In the event that the gate 213 etches at a different rate than the implant regions 207, 209 (which can result in the situation where $d_g < d_t$), the epitaxial growth may not result in the formation of a new gate region 214 having a planar surface as depicted in FIG. 16. Rather, the epitaxial growth process may cause the gate region 214 to extend above the adjacent spacer structures 215, 217 as shown in FIG. 15. In such cases, the new gate region 214 may be subjected to chemical mechanical planarization which, after silicidation, achieves the structure shown in FIG. 16.

It will be appreciated that epitaxial growth may be utilized as a means to obtain T-shaped (or L-shaped) gate structures in accordance with the teachings herein, whether or not that process is also used to define source/drain regions as in the process depicted in FIGS. 12-16. Thus, for example, an epitaxial growth process such as that illustrated in FIGS. 12-16 could also be used to form a T-shaped gate structure by starting with a device such as that depicted in FIG. 3. Also, epitaxial growth may be used in conjunction with photolithographic masking techniques to produce gate extension regions of various dimensions and geometries in accordance with the teachings herein.

Methods for making silicided gate structures have been provided herein wherein gates can be made that have a first portion with a width of 50 nm or greater, and a second portion of less than 50 nm. The first portion of the gate may be silicided in a reproducible manner without voiding and with good silicide uniformity, while the second portion may be configured with sufficiently small dimensions to meet design constraints.

The above description of the present invention is illustrative, and is not intended to be limiting. It will thus be appreciated that various additions, substitutions and modifications may be made to the above described embodiments without departing from the scope of the present invention. Accordingly, the scope of the present invention should be construed in reference to the appended claims.

What is claimed is:

1. A method for making a silicided gate, comprising:
   providing a gate comprising a first portion and a second portion, wherein the first portion has a width $w_1$ and the second portion has a width $w_2$ as taken along a plane perpendicular to the length of the gate, and wherein $w_2 > w_1$; and
   forming a layer of suicide on the second portion of the gate; wherein the gate is disposed on a substrate having at least one recess formed therein which is adjacent to the gate, wherein the second portion of the gate is formed by an epitaxial growth process, and wherein the epitaxial growth process at least partially fills the at least one recess and; wherein $w_1 < 50$ nm; and wherein $w_2 > 50$ nm.

2. The method of claim I, wherein the gate has at least one spacer adjacent thereto which is separated from the gate at least partially by a dielectric layer, and wherein the second portion of the gate is formed by a process that includes the step of etching the dielectric layer to produce a gap between the gate and the spacer.

3. The method of claim 2, further comprising the step of depositing a gate material in the gap.

4. The method of claim 3, wherein the gate material is polysilicon.

5. The method of claim 4, wherein the step of depositing a gate material in the gap includes the steps of depositing a layer of the gate material over the gap, and etching back the deposited gate material.

6. The method of claim 2, further comprising the step of epitaxially growing the gate material in the gap.

7. The method of claim 6, wherein the step of epitaxially growing the gate material in the gap results in epitaxial growth in the substrate which at least partially fills the at least one recess.

8. The method of claim 7, wherein the at least partially filled substrate forms a source or drain region of the device.

9. The method of claim 8, wherein the at least one recess has a maximum depth $d_r$, wherein the gap has a maximum depth $d_g$, and wherein $d_g \geq d_r$.

10. The method of claim 1, wherein the second portion of the gate is formed by creating a mask over the first portion of the gate, and epitaxially growing the second portion of the gate in an opening in the mask.

11. The method of claim 1, wherein the second portion of the gate is formed by:
    depositing a layer of gate material over the first portion of the gate;
    creating a mask over the layer of gate material such that a portion of the gate material is exposed; and
    removing the exposed portion of the gate material.

12. The method of claim 1, wherein the layer of suicide is cobalt silicide.

13. The method of claim 1, wherein the gate is essentially T-shaped in cross-section.

14. A method for making a silicided gate, comprising:
    providing a first portion of a gate;
    creating a mask over the first portion of the gate, the mask having an opening defined therein;
    epitaxially growing a second portion of the gate in the opening; and
    forming a layer of suicide on the second portion of the gate; wherein the first portion of the gate has a width $w_1$ and the second portion of the gate has a width $w_2$ as taken along a plane perpendicular to the length of the gate, and wherein $w_2 > w_1$ and; wherein $w_1 < 50$ nm; and wherein $w_2 > 50$ nm.

15. The method of claim 14, wherein the gate is essentially T-shaped in cross-section.

16. The method of claim 14, wherein the layer of suicide is cobalt silicide.

* * * * *

UNITED STATES PATENT AND TRADEMARK OFFICE
CERTIFICATE OF CORRECTION

PATENT NO.        : 7,534,706 B2
APPLICATION NO.   : 11/348021
DATED             : May 19, 2009
INVENTOR(S)       : James G. Boyd It is certified that error appears in the above-identified patent and that said Letters Patent is hereby corrected as shown below:

Column 5, Line 26, please delete the word "suicide" and insert therefore --silicide--.
Column 6, Line 24, please delete the word "suicide" and insert therefore --silicide--.
Column 6, Line 35, please delete the word "suicide" and insert therefore --silicide--.
Column 6, Line 43, please delete the word "suicide" and insert therefore --silicide--.

Signed and Sealed this

Eleventh Day of August, 2009

David J. Kappos
*Director of the United States Patent and Trademark Office*